United States Patent
Yoshikawa et al.

(10) Patent No.: US 7,199,677 B2
(45) Date of Patent: Apr. 3, 2007

(54) FREQUENCY MODULATION APPARATUS

(75) Inventors: Hiroyuki Yoshikawa, Machida (JP); Hisashi Adachi, Mino (JP); Shunsuke Hirano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 33 days.

(21) Appl. No.: 11/080,680

(22) Filed: Mar. 16, 2005

(65) Prior Publication Data

US 2005/0271159 A1 Dec. 8, 2005

(30) Foreign Application Priority Data

Mar. 19, 2004 (JP) .............. 2004-080335

(51) Int. Cl.
*H03C 3/06* (2006.01)
(52) U.S. Cl. ............ 332/127; 332/128; 331/16; 327/156; 375/376
(58) Field of Classification Search ........... 332/127, 332/128; 375/376; 327/156; 331/16
See application file for complete search history.

(56) References Cited

U.S. PATENT DOCUMENTS 5,903,194 A * 5/1999 Opsahl et al. .............. 331/1 A
6,717,998 B2 * 4/2004 Adachi et al. .............. 375/376
7,109,816 B2 * 9/2006 Khlat ........................ 332/112

FOREIGN PATENT DOCUMENTS

JP 5502154 4/1993

* cited by examiner

*Primary Examiner*—Arnold Kinkead
(74) *Attorney, Agent, or Firm*—Stevens, Davis, Miller & Mosher, LLP

(57) ABSTRACT

A frequency modulation apparatus 100 has a synthesizer 101, a differentiator 102 that differentiates phase modulation data and generates differential phase modulation data, an adder 103 that adds together that differential phase modulation data and carrier frequency data fractional part K and generates addition fractional part K1, an input data operation section 104 that receives addition fractional part K1 and carrier frequency data integer part M, generates integer part input data M1 and fractional part input data K2, and provides fractional part input data K2 to synthesizer 101, and an integer part data delay section 105 that delays integer part input data M1 before providing it to synthesizer 101. Input data operation section 104 makes M1=M−1 and K2=K1+1 when K1<0, makes M1=M and K2=K1 when 0≦K1<1, and makes M1=M+1 and K2=K1−1 when 1≦K1.

8 Claims, 11 Drawing Sheets

PRIOR ART

FREQUENCY MODULATION APPARATUS

BACKGROUND OF THE INVENTION

1. Field of the Invention

The present invention relates to a frequency modulation apparatus that modulates a frequency based on phase modulation data.

2. Description of the Related Art

FIG. 1 shows an example of a conventional synthesizer. This synthesizer 10 is equipped with a voltage controlled oscillator (hereinafter referred to as "VCO") 11, a frequency divider 12, a phase comparator 13, a reference oscillator 14, and a loop filter 15.

VCO 11 provides a desired output frequency fo, and supplies this to frequency divider 12. The output of frequency divider 12 is supplied to one input of phase comparator 13, and the other input of phase comparator 13 is supplied from reference oscillator 14. The output of phase comparator 13 is filtered by loop filter 15 to eliminate unwanted noise components.

The output of loop filter 15 is then fed back to the control input of VCO 11, by which means output frequency fo of VCO 11 is adjusted so as to become a division ratio multiple value of the frequency of the reference oscillator 14. The reference frequency (fr) and the comparative frequency obtained by 1/M frequency division of the VCO output (fo) by a variable frequency divider are input to phase comparator 13. The loop stabilizes in the fr=fo/M state.

Thus, the output frequency (fo) becomes fr·M, and the VCO output frequency can be varied in frequency steps Δf=fr by varying frequency division ratio M.

Another example of a conventional synthesizer is shown in FIG. 2. This synthesizer 20 is equipped with a voltage controlled oscillator (hereinafter referred to as "VCO") 11, a frequency divider 12, a phase comparator 13, a reference oscillator 14, a loop filter 15, and an accumulator 21.

Accumulator 21 is equipped with an adder 22, a comparator 23, and a feedback logic section 24. Adder 22 adds together numerator data K and an addition feedback value from feedback logic section 24. Comparator 23 compares the output value of adder 22 with the reference value, provides a carry output signal to frequency divider 12, and provides the adder 22 output value to feedback logic section 24 where it is held.

If the frequency division ratio of frequency divider 12 is M, when the contents of accumulator 21 become L or greater, an overflow (OVF) signal is output and the frequency division ratio of frequency divider 12 is made M+1. If accumulator 21 increases its contents by K in one reference cycle, the contents will be αK after α cycles. Here, K is an integer such that α>1, K≧0, and L>K.

When αK≧L, accumulator 21 outputs an overflow signal, makes the frequency divider 12 frequency division ratio M+1, and also makes its contents +K−L and performs incrementing again every cycle.

Accumulator 21 causes overflow K times during an L cycle, frequency divider 12 frequency division ratio M is M+1K times in an L cycle and M the remaining L−K times (see FIG. 4). Thus, the average frequency division ratio per L cycle is M+K/L.

Therefore, in the synthesizer shown in FIG. 2, frequency steps can be made small since the average frequency division ratio is M+K/L. However, a problem with the kind of configuration shown in FIG. 2 is that a high level of spurious emission occurs in the vicinity of the center frequency. This is because frequency division ratio M varies with an L cycle as the fundamental period, and the VCO output signal is modulated since 1/L and integer multiple frequency components appear in the phase comparator output signal. Possible ways of reducing this spurious emission are to vary frequency division ratio M frequently, make the varied low-frequency component lower, and make the high-frequency component higher. The higher the frequency component, the more easily it can be reduced with the loop filter 15 cutoff frequency.

Another example of a conventional synthesizer is shown in FIG. 3 (see Japanese Patent Publication No. HEI 5-502154). This synthesizer 30 has a multi-stage accumulator digital network 31 instead of accumulator 21 in the synthesizer shown in FIG. 2.

Multi-stage accumulator digital network 31 is equipped with a plurality of stages of accumulators 32, a plurality of digital delay networks 33, and an adder 34. In synthesizer 30, multi-stage accumulator digital network 31 processes numerator data containing modulation information, generates a precise carry output signal and provides this to frequency divider 12, and performs frequency division ratio changes precisely. In synthesizer 30 shown in FIG. 3, carry output signals of the second-stage and subsequent accumulators (integration circuits) are input to a differentiation circuit and become 0 when averaged, as a result of which frequency division ratio changes are frequent as shown in FIG. 5.

However, a problem with conventional synthesizer 30 shown in FIG. 3 is that, since it can only process numerator data in the range from 0 or above to less than 1, it cannot be used directly in a frequency modulation apparatus that processes phase modulation data exceeding the range from 0 or above to less than 1.

SUMMARY OF THE INVENTION

It is an object of the present invention to provide a high-precision frequency modulation apparatus that has a precision synthesizer and also has a simple configuration.

A first aspect of the invention has a synthesizer; an adder that adds together differential phase modulation data and carrier frequency data fractional part K and generates an addition fractional part K1; an input data operation section that receives addition fractional part K1 and carrier frequency data integer part M, generates integer part input data M1 and fractional part input data K2, and provides fractional part input data K2 directly to the synthesizer; and an integer part data delay section that provides integer part input data M1 to the synthesizer delayed from first generation to second generation of a clock signal; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a delta sigma modulation section that by integrating and delaying fractional part input data K2 from the input data operation section to generate a delayed signal and adding together a value of the delayed signal and the value of integer part input data M1 from the integer part data delay section performs delta sigma modulation of fractional part input data K2, generates the control input signal, and provides this control input signal to the loop frequency divider.

A second aspect of the invention has a synthesizer; a differentiator that differentiates phase modulation data and generates differential phase modulation data; an adder that adds together the differential phase modulation data and carrier frequency data fractional part K and generates an addition fractional part K1; an input data operation section that receives addition fractional part K1 and carrier frequency data integer part M, generates integer part input data M1 and fractional part input data K2, and provides fractional part input data K2 directly to the synthesizer; and an integer part data delay section that provides integer part input data M1 to the synthesizer delayed from first generation to second generation of a clock signal; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together fractional part input data K2 and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that integrates the latched output signal and generates a second carry output signal at the time of second generation of the clock signal; a section that delays the first carry output signal until second generation of the clock signal; a section that differentiates the second carry output signal; and a section that combines delayed integer part input data M1 and the delayed first carry output signal and the differentiated second carry output signal and generates the aforementioned control input signal; and wherein the input data operation section makes M1=M−1 and K2=K1+1 when K1<0, makes M1=M and K2=K1 when 0≦K1<1, and makes M1=M+1 and K2=K1−1 when 1≦K1.

A third aspect of the invention has a synthesizer; an input data operation section that receives phase modulation data K3 and carrier frequency data integer part M, and generates integer part input data M1 and phase modulation data K4; an integer part data delay section that provides integer part input data M1 to the synthesizer delayed from first generation to second generation of a clock signal; and a phase modulation input data adder that receives phase modulation data K4; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a delta sigma modulation section that by integrating and delaying carrier frequency data fractional part K to generate a delayed signal and adding together a value of the delayed signal and the value of integer part input data M1 from the integer part data delay section performs delta sigma modulation of fractional part K, generates the control input signal, and provides this control input signal to the loop frequency divider.

A fourth aspect of the invention has a synthesizer; an input data operation section that receives phase modulation data K3 and carrier frequency data integer part M, and generates integer part input data M1 and phase modulation data K4; an integer part data delay section that provides integer part input data M1 to the synthesizer delayed from first generation to second generation of a clock signal; and a phase modulation input data adder that receives phase modulation data K4; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines delayed integer part input data M1 and the delayed first carry output signal and the differentiated second carry output signal and generates the aforementioned control input signal; and wherein the input data operation section makes M1=M−1 and K4=K3+1 when K3<0, makes M1=M and K4=K3 when 0≦K3<1, and makes M1=M+1 and K4=K3−1 when 1≦K3; and the phase modulation input data adder adds together phase modulation data K4 and the integrated value of the output signal latched by the first feedback logic section, generates the input data addition output signal, and provides this input data addition output signal to the second adder.

A fifth aspect of the invention has a synthesizer; an input data operation section that adds a predetermined fixed value to a phase modulation data value and generates modulation input data K5; and a phase modulation input data adder that receives phase modulation data K5; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a reference value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines carrier frequency data integer part input data M and the delayed first carry output signal and the differentiated second carry output signal and generates the aforementioned control input signal; and wherein the phase modulation input data adder adds together phase modulation data K5 and the value of the output signal latched by the first feedback logic section, generates the input data addition output signal, and provides this input data addition output signal to the second adder.

A sixth aspect of the invention has a synthesizer and a phase modulation input data adder that receives phase modulation data; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines carrier frequency data integer part input data M and the delayed first carry output signal and the differentiated second carry output signal and generates the aforementioned control input signal; and wherein the phase modulation input data adder adds together the phase modulation data and the value of the output signal latched by the first feedback logic section, generates the input data addition output signal, and provides this input data addition output signal to the second adder.

BRIEF DESCRIPTION OF THE DRAWINGS

The above and other objects and features of the invention will appear more fully hereinafter from a consideration of the following description taken in conjunction with the accompanying drawing wherein one example is illustrated by way of example, in which.

DETAILED DESCRIPTION OF THE PREFERRED EMBODIMENTS

With reference now to the accompanying drawings, embodiments of the present invention will be explained in detail below.

(Embodiment 1)

Figure 1:
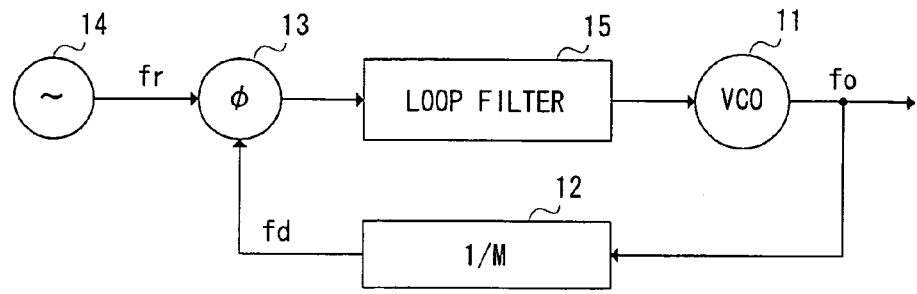
FIG. 1 is a block diagram showing the configuration of a conventional synthesizer.
Figure 2:
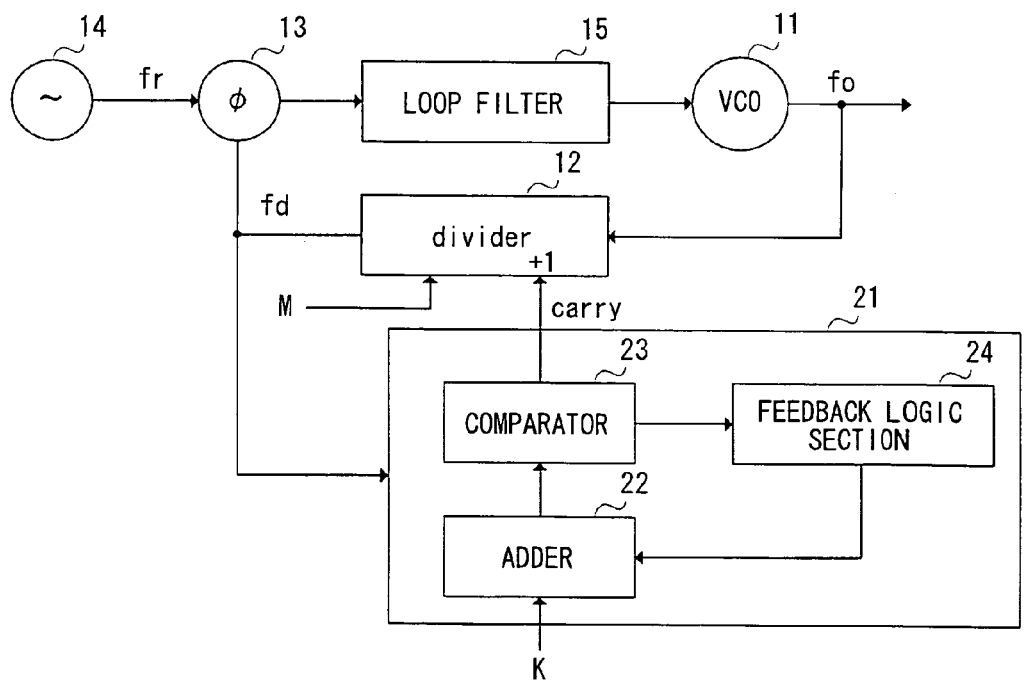
FIG. 2 is a block diagram showing the configuration of another conventional synthesizer.
Figure 3:
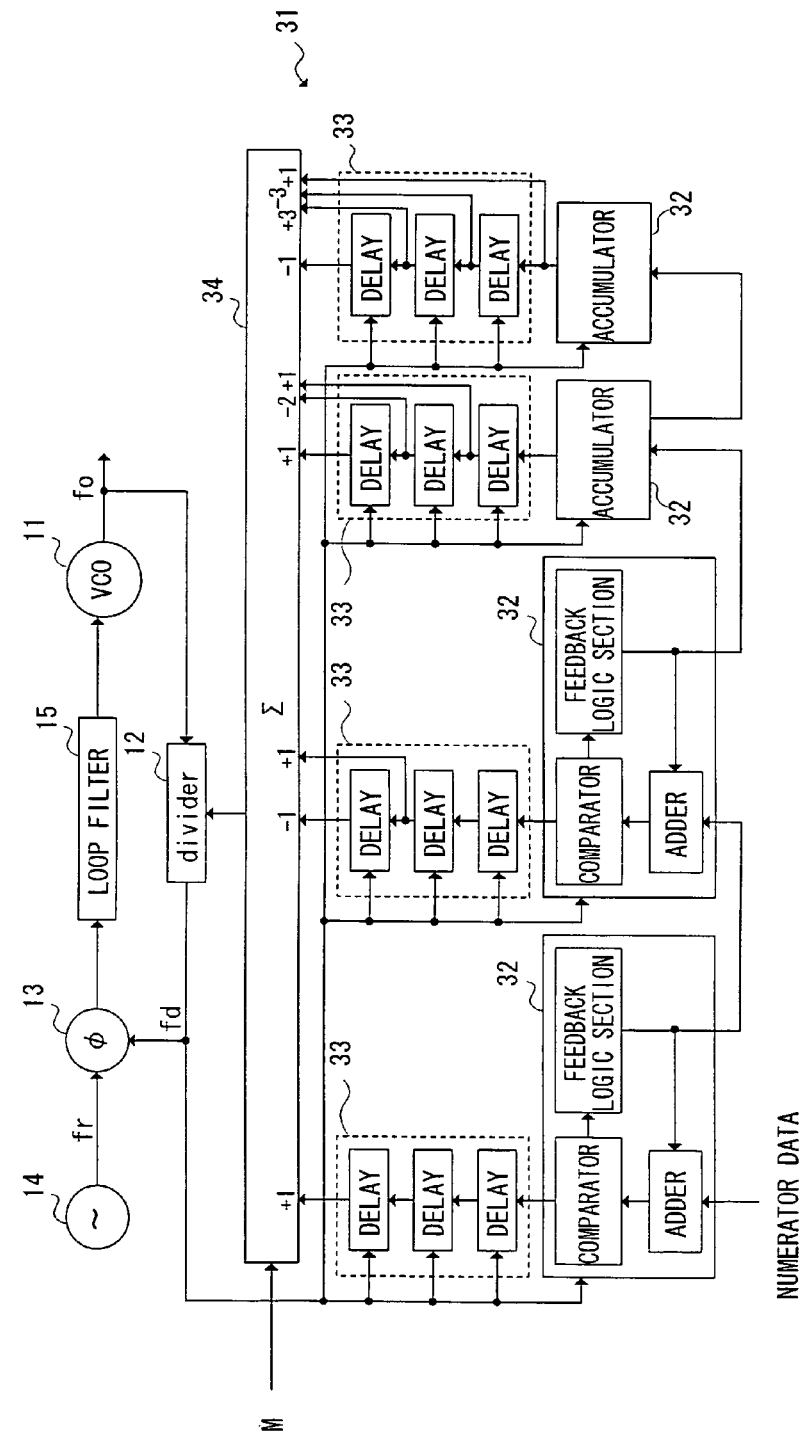
FIG. 3 is a block diagram showing the configuration of another conventional synthesizer;.
Figure 4:
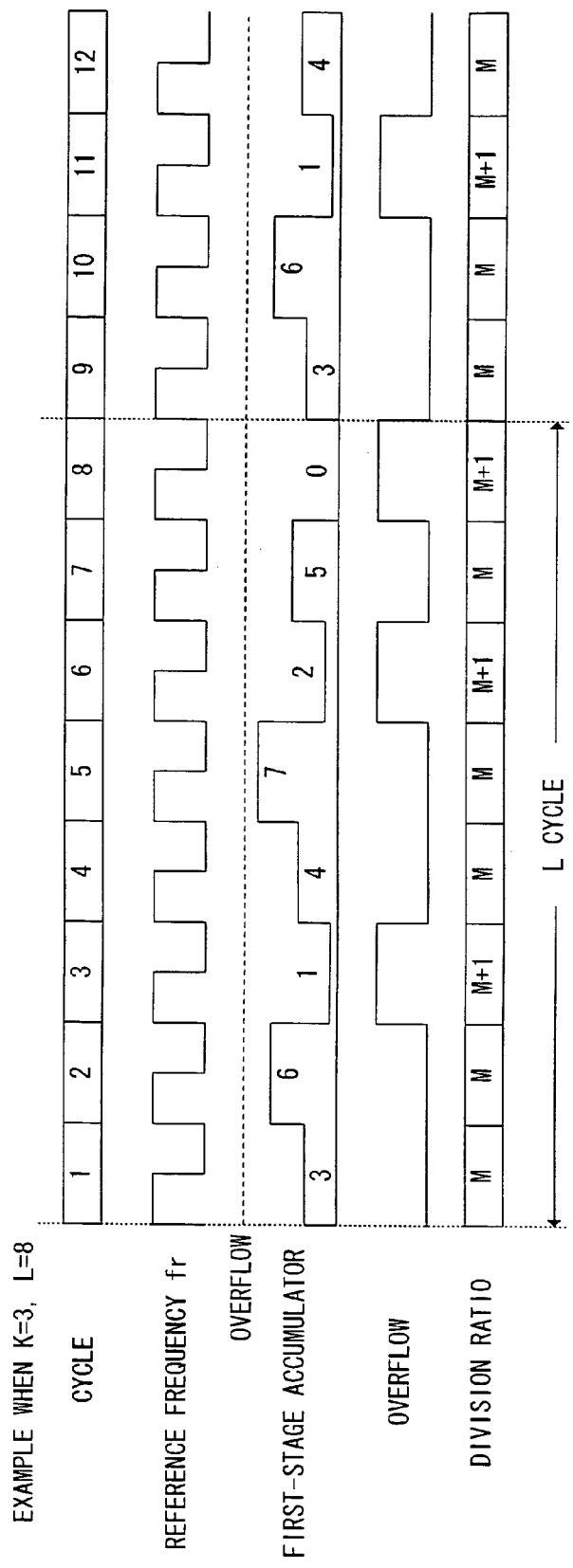
FIG. 4 is a drawing for explaining the operation of the conventional synthesizer shown in FIG. 2.
Figure 5:
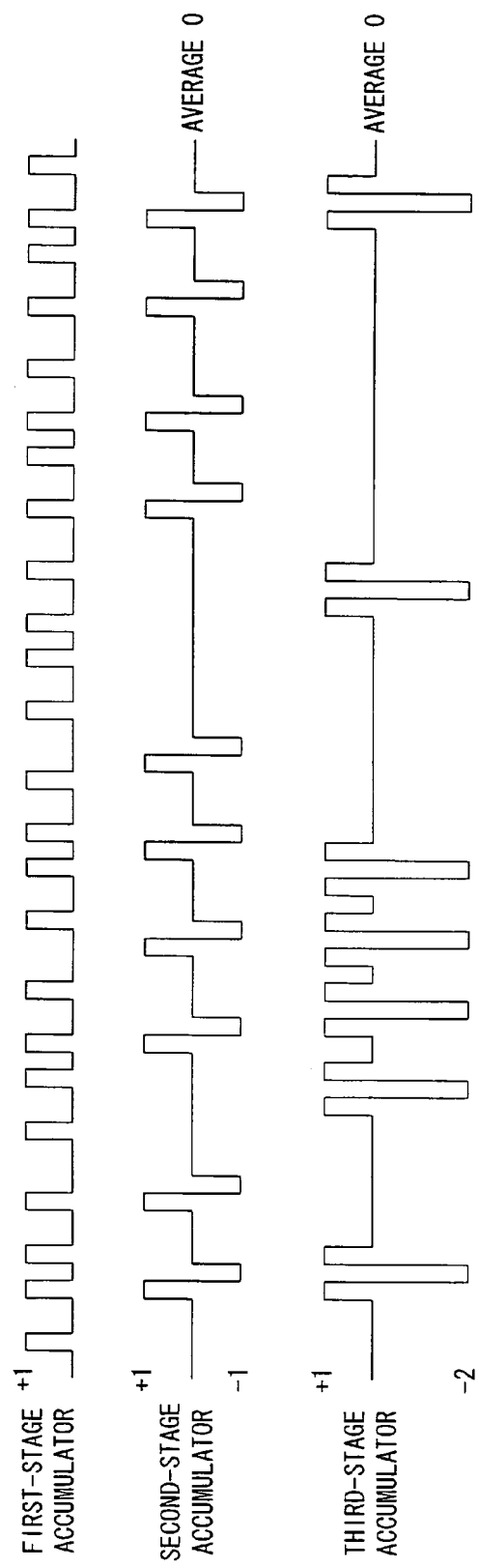
FIG. 5 is a drawing for explaining the operation of the other conventional synthesizer shown in FIG. 3.
Figure 6:
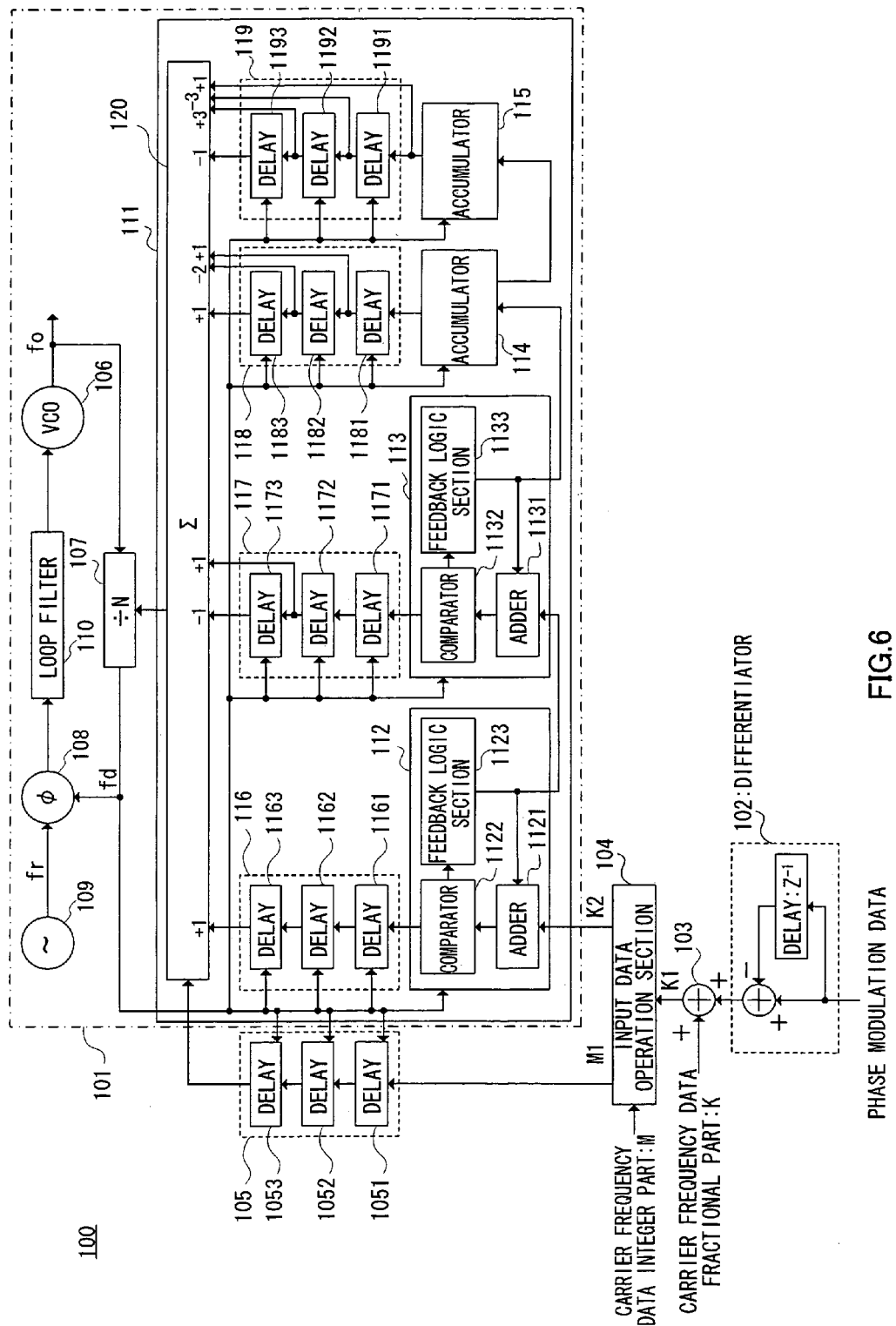
FIG. 6 is a block diagram showing the configuration of a frequency modulation apparatus according to Embodiment 1 of the present invention.

FIG. 6 is a block diagram showing the configuration of a frequency modulation apparatus according to Embodiment 1 of the present invention.

As shown in FIG. 6, a frequency modulation apparatus 100 according to Embodiment 1 of the present invention is equipped with a synthesizer 101, a differentiator 102, an adder 103, an input data operation section 104, and an integer part data delay section 105.

Differentiator 102 differentiates phase modulation data and generates differential phase modulation data (frequency modulation data). Adder 103 adds together differential phase modulation data from differentiator 102 and carrier frequency data fractional part K, and generates addition fractional part K1. Input data operation section 104 receives addition fractional part K1 from adder 103 and carrier frequency data integer part M, generates integer part input data M1 and fractional part input data K2, and provides the fractional part input data K2 to synthesizer 101. Integer part data delay section 105 delays integer part input data M1 from input data operation section 104 before providing that data to synthesizer 101. Integer part data delay section 105 has three delay elements 1051, 1052, and 1053.

Synthesizer 101 is equipped with a voltage controlled oscillator (VCO) 106, a variable frequency divider 107, a phase comparator 108, a reference oscillator 109, a loop filter 110, and a multi-stage accumulator digital network 111. This multi-stage accumulator digital network 111 forms a delta sigma modulation apparatus.

VCO 106 provides a high-frequency phase modulation signal of desired output frequency fo, and supplies input to variable frequency divider 107. The output of frequency divider 107 is supplied to one input of phase comparator 108, and the other input of phase comparator 108 is supplied from reference oscillator 109. The output of phase comparator 108 is filtered by loop filter 110 to eliminate unwanted noise components.

The output of loop filter 110 is then fed back to the control input of VCO 106, by which means output frequency fo of VCO 11 is adjusted so as to become a digital division ratio multiple value of the frequency divider 107 for the reference oscillator 109 frequency.

Multi-stage accumulator digital network 111 is for providing a control signal for controlling the division ratio to variable frequency divider 107. Multi-stage accumulator digital network 111 is equipped with a plurality of stages of accumulators 112, 113, 114, and 115, a plurality of digital delay networks 116, 117, 118, and 119, and an adder 120.

Accumulator 112 is equipped with an adder 1121, a comparator 1122, and a feedback logic section 1123. Accumulator 113 also is equipped with an adder 1131, a comparator 1132, and a feedback logic section 1133. Accumulators 114 and 115 have the same configuration as accumulators 112 and 113.

Digital delay network 116 is equipped with three delay elements 1161, 1162, and 1163. Digital delay network 117 is equipped with three delay elements 1171, 1172, and 1173. Digital delay network 118 is equipped with three delay elements 1181, 1182, and 1183. Digital delay network 119 is equipped with three delay elements 1191, 1192, and 1193.

In a preferred sample implementation, variable frequency divider 107 division ratio N is varied in a period sequence, and VCO 106 output frequency fo can be adjusted in frequency steps equal to the fraction of the reference oscillator 109 frequency. This period sequence is generated by multi-stage accumulator digital network 111. A four-accumulator multi-stage accumulator digital network 111 is shown in FIG. 6.

Fractional part input data K2 from input data operation section 104 is applied directly to adder 1121 of accumulator 112. Adder 1121 adds together fractional part input data K2 and a first addition feedback value. Comparator 1122 compares the adder 1121 output value with a predetermined numeric value and generates a first carry output signal, and provides the adder 1121 output value to feedback logic section 1123. Feedback logic section 1123 latches (stores) the adder 1121 output value (output signal).

After being processed by accumulator 112, data output from accumulator 112 is extracted in feedback logic section 1123 output. The above-described data output can be used after a clock input signal extracted from frequency divider 107 has clocked accumulator 112.

Data that appears in the next accumulator after one accumulator is simply transferred to the next accumulator in a string during one clock cycle, by which means it is possible to prevent the problem of rippling through all the accumulators within one clock pulse.

The contents of the next lower accumulator are supplied to each accumulator ahead of the first accumulator. Each accumulator digitally integrates the contents of the next lower accumulator with first accumulator 112 and executes digital integration of fractional part input data K2. Second accumulator 113 executes double integration of fractional part input data K2, third accumulator 114 executes triple integration of fractional part input data K2, and fourth accumulator 115 executes quadruple integration of fractional part input data K2.

The output of each accumulator is a carry output signal—that is, an overflow output signal. For first accumulator 112, this output indicates that VCO output frequency fo has attained a 360-degree phase error with respect to the frequency of the signal output from reference oscillator 109. In order to correct this, the division ratio of variable frequency divider 107 is increased by one integer for the next clock interval, and accumulator 112 internal data is reduced accordingly. As a result of this action one cycle of output frequency fo is eliminated from the phase comparator 108 input, and therefore a 360-degree phase correction is made in the VCO 106 output.

This correction occurs only at the point at which output frequency fo reaches a 360-degree phase error without loop filter 110. Under such conditions a sawtooth waveform occurs in the phase comparator 108 output, and this must then be filtered by loop filter 110. The average value of this sawtooth waveform is the correct control signal for selecting the frequency giving the interval of fractional incrementation of reference frequency output from reference oscillator 109.

However, internal data of first accumulator 112 shows an intermediate phase error. The highest-level accumulator is included so as to operate on accumulator 112 internal data, by which means intermediate correction is provided for the phase error, as a result of which the sawtooth waveform can be subdivided frequency-wise, enabling noise output in the reference frequency of the original sawtooth waveform to be reduced.

The output of the highest-level accumulator is supplied via digital delay networks 116, 117, 118, and 119 that execute derivative operations of carry output signal. As these accumulator carry output signals are digital integrals of numerator data input, higher-order correction is performed for the desired phase.

For example, the carry output signal of second accumulator 113 is applied to digital delay network 117, and is there delayed by ordinary delay elements 1171, 1172, and 1173 before being supplied to adder 120.

In adder 120, the delayed output of second accumulator 113 is added to the negative value of the previous value obtained from the output of ordinary delay element 1173. In digital terms, this is a first derivative. As the output of second accumulator 113 is the second integral of fractional part input data K2, the net output of this configuration is a secondary phase correction of the fractional frequency offset (note that this is a frequency offset that is a fractional part input data K2 phase derivative).

The carry output signal of third accumulator 114 is applied to digital delay network 118, where this carry output signal is delayed by delay element 1181, and added to the sum of twice the negative value of the previous value and the value before that. This "previous value" and "value before that" are obtained from the outputs of delay elements 1181 and 1183 respectively. This is equivalent to a second digital derivative. As the output of third accumulator 114 shows the third integral of fractional part input data K2, the overall result is tertiary correction for the phase of the fractional frequency offset.

This technique can be executed for the desired degree of correction by adding a large number of accumulator components to multi-stage accumulator digital network 111. The coefficients of the addition of each sequence correspond to the factors in the expansion of $(1-z^{-1})^X$ {where X is the degree of the accumulator being considered}. Other coefficients can also be introduced so that the sum of the coefficients for the first accumulator is 1 and the sum of the coefficients for all the other higher-level accumulators is 0. However, any other than the above-described coefficient selection will result in less than optimal noise elimination performance.

For example, the carry-out output sequence of fourth accumulator 115 applied to digital delay network 119 is delayed by 3 cycles from the carry-out output sequence of first accumulator 112, the carry-out output sequence of third accumulator 114 is delayed by 2 cycles from the carry-out output sequence of first accumulator 112, and the carry-out output sequence of second accumulator 113 is delayed by 1 cycle from the carry-out output sequence of first accumulator 112. In order to arrange these sequences time-wise, first accumulator 112 output is delayed three times by delay elements 1161, 1162, and 1163, second accumulator 113 output is delayed twice by delay elements 1171 and 1172, and third accumulator 114 output is delayed once by delay element 1181. All other delay elements of digital delay networks 116, 117, 118, and 119 are related to digital differentiation processing. Also, in this case, integer part input data M1 from input data operation section 104 is delayed three times by the three delay elements 1051, 1052, and 1053 of integer part data delay section 105.

The principles of the operation of frequency modulation apparatus 100 according to Embodiment 1 of the present invention will now be described in detail.

If the modulation output frequency is designated fo+Δf(t), the division ratio of variable frequency divider 107 is designated M, the fractional part of carrier frequency data is designated K, and the phase modulation signal is designated ΔK(t), then modulation output frequency fo+Δf(t) is expressed by Equation 1 below.

$$fo + \Delta f(t) = \left(M + \frac{K + \Delta K(t)}{L}\right) fr \quad \text{(Equation 1)}$$

Since ΔK(t) is a modulation signal and a positive or negative value is input, fractional part input data K2 input to accumulator 112 may incur positive overflow or negative overflow. Therefore, overflow countermeasures are taken by provision of input data operation section 104 prior to input to accumulator 112.

Input data operation section 104 makes M1=M−1 and K2=K1+1 when K1<0, makes M1=M and K2=K1 when 0≦K1<1, and makes M1=M+1 and K2=K1−1 when 1≦K1, inputs K2 to accumulator 112, and inputs M1 to adder 120 via integer part data delay section 105.

Thus, in Embodiment 1 of the present invention, there are provided a differentiator 102 that differentiates phase modulation data and generates differential phase modulation data, an adder 103 that adds together the differential phase modulation data and carrier frequency data and generates addition fractional part K1, an input data operation section 104 that receives addition fractional part K1 and carrier frequency data integer part M, generates integer part input data M1 and fractional part input data K2, and provides fractional part input data K2 to adder 1121 of synthesizer 101, and an integer part data delay section 105 that provides integer part input data M1 to adder 120 of synthesizer 101 delayed from the first generation to the second generation of the clock signal; and input data operation section 104 makes M1=M−1 and K2=K1+1 when K1<0, makes M1=M and K2=K1 when 0≦K1<1, and makes M1=M+1 and K2=K1−1 when 1≦K1, thereby enabling a high-precision frequency modulation apparatus 100 to be provided that has a precision synthesizer 101 and has a simple configuration.

(Embodiment 2)

Embodiment 2 of the present invention will now be explained in detail below with reference to the accompanying drawings.

Figure 7:
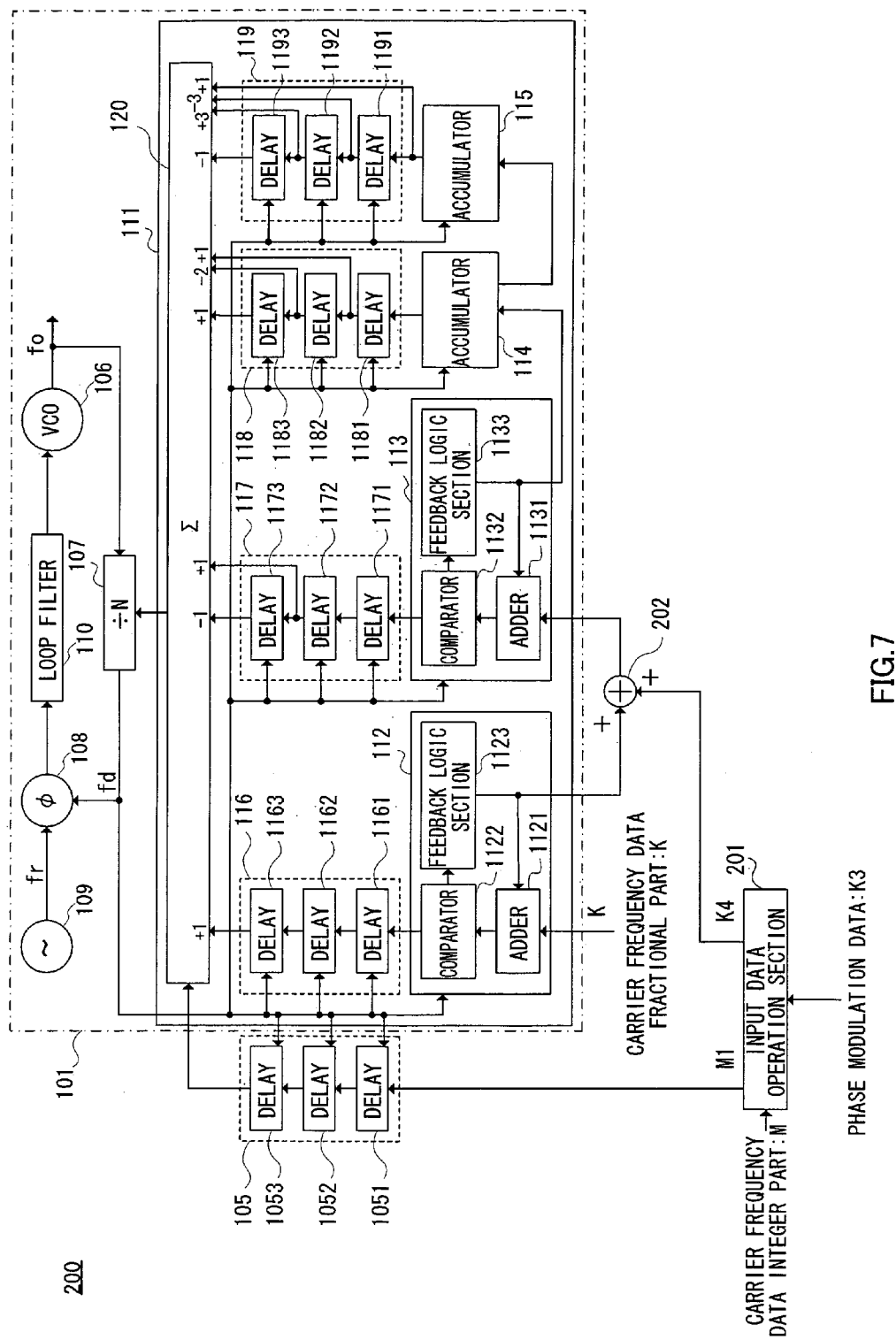
FIG. 7 is a block diagram showing the configuration of a frequency modulation apparatus according to Embodiment 2 of the present invention.

FIG. 7 is a block diagram showing the configuration of a frequency modulation apparatus according to Embodiment 2 of the present invention. Configuration elements in Embodiment 2 of the present invention identical to those in Embodiment 1 of the present invention are assigned the same reference codes as in Embodiment 1, and descriptions thereof are omitted.

As shown in FIG. 7, a frequency modulation apparatus 200 according to Embodiment 2 of the present invention is equipped with a synthesizer 101, an input data operation section 201, an integer part data delay section 105, and a phase modulation input data adder 202.

Frequency modulation apparatus 200 according to Embodiment 2 of the present invention has a configuration in which differentiator 102 in Embodiment 1 of the present invention has been eliminated.

Synthesizer 101 is the same as that in Embodiment 1 of the present invention. Input data operation section 201 receives phase modulation data K3 and carrier frequency data integer part M, and generates integer part input data M1 and phase modulation data K4. Integer part data delay section 105 is the same as that in Embodiment 1 of the present invention. Phase modulation input data adder 202 receives phase modulation data K4 directly, adds together this phase modulation data K4 and the output signal value latched in feedback logic section 1123, and provides the output value to adder 1131 of accumulator 113.

The reason why frequency modulation apparatus 200 according to Embodiment 2 of the present invention does not need differentiator 102 will now be explained.

The reason for eliminating differentiator 102 in FIG. 6 is explained below with reference to the accumulator Z transformation model in FIG. 8.

Figure 8:
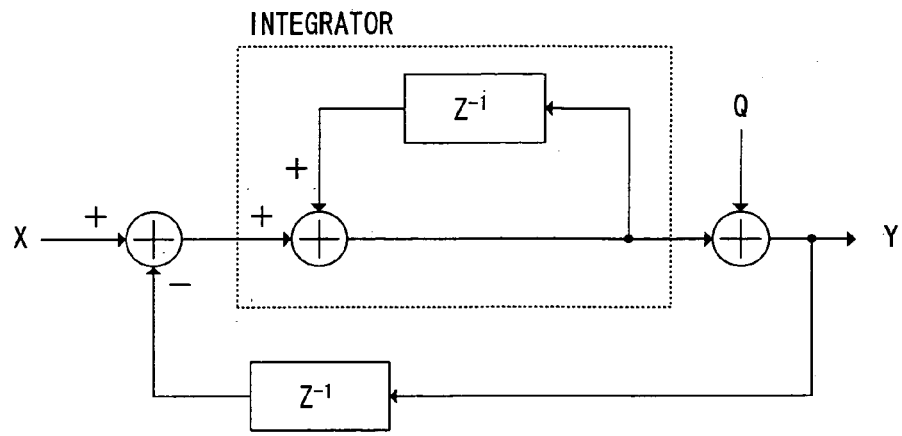
FIG. 8 is a drawing showing an accumulator Z transformation model for explaining the operation of a frequency modulation apparatus according to Embodiment 2 of the present invention.

FIG. 8 is a drawing showing the configuration of an accumulator in the form of a Z transformation model. X is the input data and Y is the carry output signal. The integrator outputs a carry output signal when the integration result exceeds a certain value. Output signal Y equal to traversal of a 1-bit quantizer is expressed by Equation 2 and Equation 3 below.

$$Y = \frac{1}{1-Z^{-1}}(X - Z^{-1}Y) + Q \quad \text{(Equation 2)}$$

$$Y = X + (1 - Z^{-1})Q \quad \text{(Equation 3)}$$

In output signal Y, quantization noise Q is differentiated, and the lower the frequency region the greater is the noise attenuation.

Figure 9:
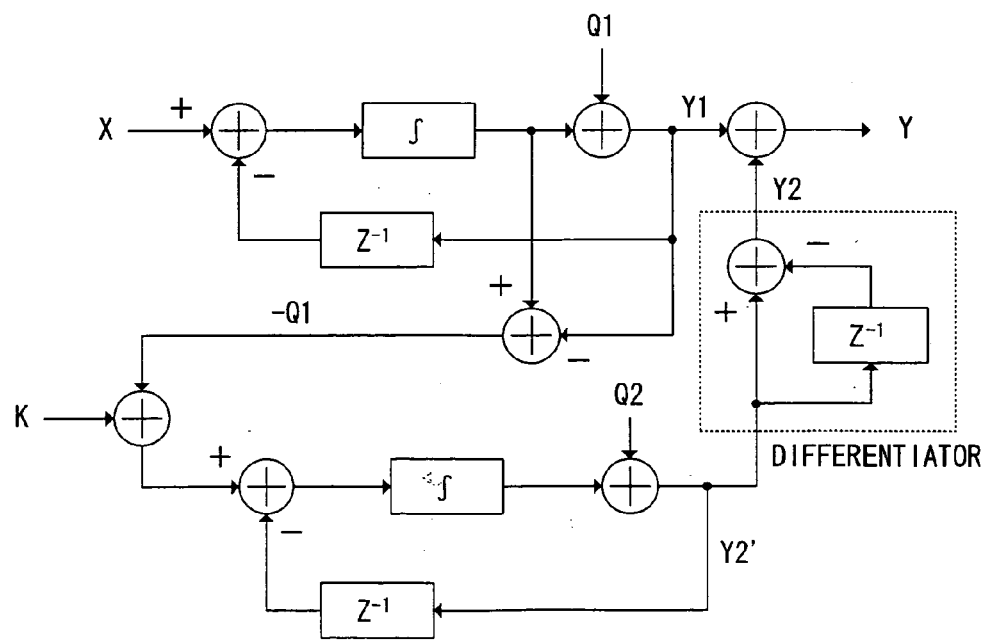
FIG. 9 is a drawing showing another accumulator Z transformation model for explaining the operation of a frequency modulation apparatus according to Embodiment 2 of the present invention.

FIG. 9 shows a Z transformation model of a two-stage accumulator. When a phase modulation signal K is input to a two-stage accumulator and calculation is performed in the same way as described above, output signal Y is found by means of Equation 4 through Equation 12 below.

$$Y1 = X + (1-Z^{-1})Q1 \quad \text{(Equation 4)}$$

$$Y2' = K - Q1 + (1-Z^{-1})Q2 \quad \text{(Equation 5)}$$

$$Y2 = Y2' - Z^{-1}Y2' \quad \text{(Equation 6)}$$

$$Y2 = Y2'(1 31\ Z^{-1}) \quad \text{(Equation 7)}$$

$$Y2 = (1-Z^{-1})(K - Q1 + (1-Z^{-1})Q2) \quad \text{(Equation 8)}$$

$$Y2 = K - Q1 + (1-Z^{-1})Q2 - KZ^{-1} + Q1Z^{-1} - (1-Z^{-1})Q2Z^{-1} \quad \text{(Equation 9)}$$

$$Y2 = -Q1(1-Z^{-1}) + Q2(1-Z^{-1})^2 + K(1-Z^{-1}) \quad \text{(Equation 10)}$$

$$Y = Y1 + Y2 \quad \text{(Equation 11)}$$

$$Y = X + Q2(1-Z^{-1})^2 + K(1-Z^{-1}) \quad \text{(Equation 12)}$$

In output signal Y, quantization noise undergoes secondary differentiation, and phase modulation data K undergoes primary differentiation. Therefore, the differentiation circuit that receives phase modulation data ΔK(t) input shown in FIG. 6 is eliminated.

Also, when phase modulation data is input to the inputs of a three-stage accumulator, input phase modulation data is input after primary integration, and in the case of a four-stage accumulator, secondary integration is necessary.

Thus, in Embodiment 2 of the present invention, there are provided an input data operation section 201 that receives phase modulation data K3 and carrier frequency data integer part M and generates integer part input data M1 and phase modulation data K4, an integer part data delay section 105 that provides integer part input data M1 to adder 120 of synthesizer 101 delayed from the first generation to the second generation of the clock signal, and a phase modulation input data adder 202 that receives phase modulation data K4; input data operation section 201 makes M1=M−1 and K4=K3+1 when K3<0, makes M1=M and K4=K3 when 0≦K3<1, and makes M1=M+1 and K4=K3−1 when 1≦K3; and phase modulation input data adder 202 adds together phase modulation data K4 and the integral value of the output signal latched by first feedback logic section 1121, generates the aforementioned input data addition output signal, and provides this signal to second adder 1131; thereby enabling a high-precision frequency modulation apparatus 200 to be provided that has a precision synthesizer 101 and has a simple configuration.

(Embodiment 3)

Embodiment 3 of the present invention will now be explained in detail below with reference to the accompanying drawings.

Figure 10:
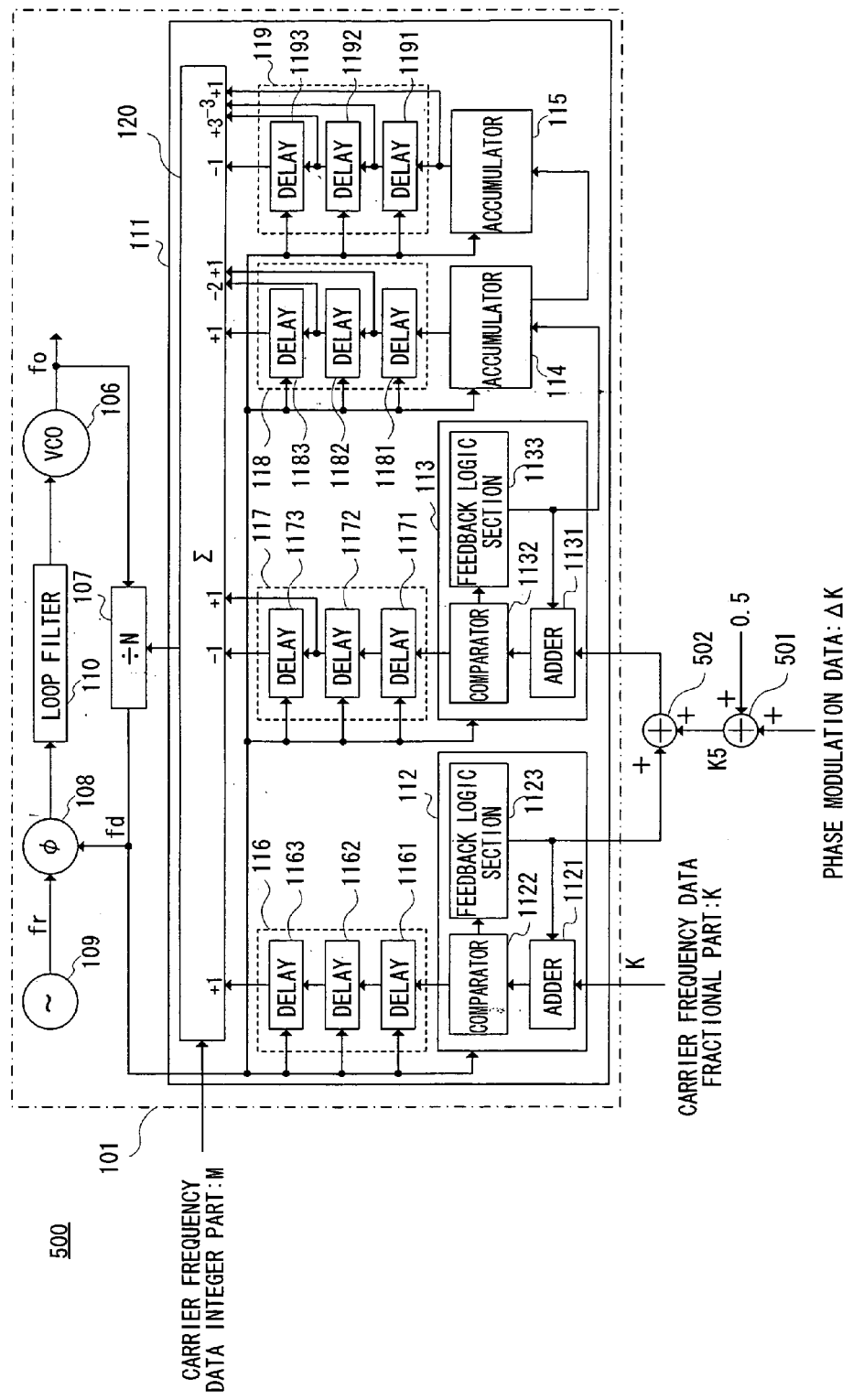
FIG. 10 is a block diagram showing the configuration of a frequency modulation apparatus according to Embodiment 3 of the present invention.

FIG. 10 is a block diagram showing the configuration of a frequency modulation apparatus according to Embodiment 3 of the present invention. Configuration elements in Embodiment 3 of the present invention identical to those in Embodiment 1 of the present invention are assigned the same reference codes as in Embodiment 1, and descriptions thereof are omitted.

As shown in FIG. 10, a frequency modulation apparatus 500 according to Embodiment 3 of the present invention is equipped with a synthesizer 101, an input data operation section 501, and a phase modulation input data adder 502. Frequency modulation apparatus 500 according to Embodiment 3 of the present invention is applied to cases where the value of phase modulation data ΔK is in the range −0.5<ΔK<0.5.

Synthesizer 101 is the same as that in Embodiment 1 of the present invention. Input data operation section 501 adds 0.5 to the phase modulation data value (performing transformation to 0<ΔK<1) and generates modulation input data K5. Phase modulation input data adder 502 receives phase modulation data K5, adds together this phase modulation data K5 and the output signal value latched in feedback logic section 1123, and provides the output value to adder 1131 of accumulator 113.

Embodiment 3 of the present invention is applied to a case where the absolute value of phase modulation data ΔK is greater than 0 and less than 1. In this case, if a predetermined fixed value is designated L, it is necessary for a predetermined fixed value L such that 0<(ΔK+L)<1 to be input to input data operation section 501.

Thus, in Embodiment 3 of the present invention there are provided an input data operation section 501 that adds 0.5 to the phase modulation data value and generates modulation input data K5, and a phase modulation input data adder 502 that receives phase modulation data K5; and phase modulation input data adder 502 adds together phase modulation data K5 and the value of the output signal latched by first feedback logic section 1121, generates an input data addition output signal, and provides this signal to second adder 1131; thereby enabling a high-precision frequency modulation apparatus 500 to be provided that has a precision synthesizer 101 and has a simple configuration.

(Embodiment 4)

Embodiment 4 of the present invention will now be explained in detail below with reference to the accompanying drawings.

Figure 11:
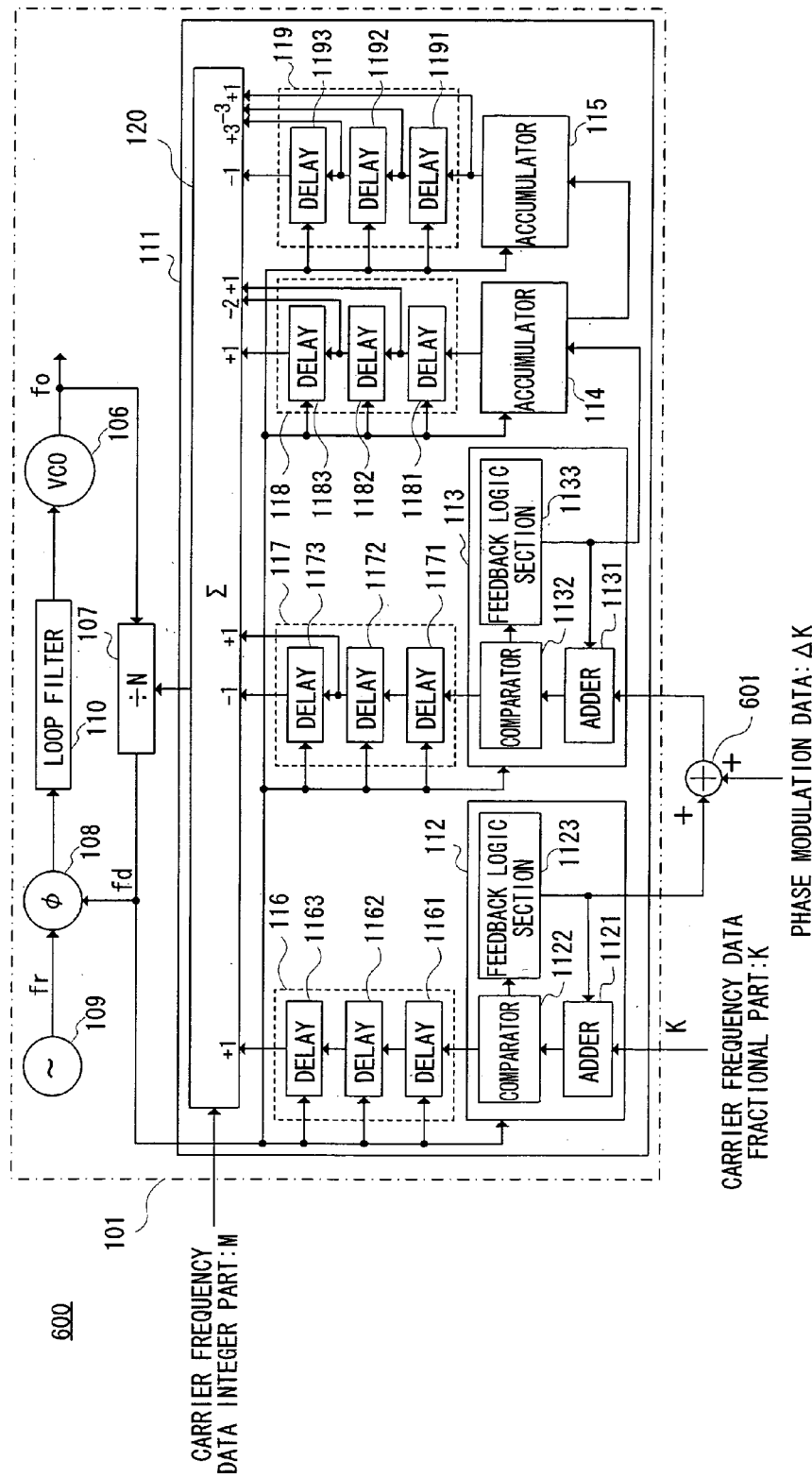
FIG. 11 is a block diagram showing the configuration of a frequency modulation apparatus according to Embodiment 4 of the present invention.

FIG. 11 is a block diagram showing the configuration of a frequency modulation apparatus according to Embodiment 4 of the present invention. Configuration elements in Embodiment 4 of the present invention identical to those in Embodiment 1 of the present invention are assigned the same reference codes as in Embodiment 1, and descriptions thereof are omitted.

As shown in FIG. 11, a frequency modulation apparatus 600 according to Embodiment 4 of the present invention is equipped with a synthesizer 101 and a phase modulation input data adder 601. Frequency modulation apparatus 600 according to Embodiment 4 of the present invention is applied to cases where the value of phase modulation data ΔK is in the range 0<ΔK<1.

Phase modulation input data adder 601 adds together phase modulation data ΔK and the output signal value latched in feedback logic section 1123, and provides the output value to adder 1131 of accumulator 113.

Thus, in Embodiment 4 of the present invention there is provided a phase modulation input data adder 601 that receives phase modulation data, and phase modulation input data adder 601 adds together the aforementioned phase modulation data and the value of the output signal latched by first feedback logic section 1121, generates an input data addition output signal, and provides this signal to second adder 1131, thereby enabling a high-precision frequency modulation apparatus 600 to be provided that has a precision synthesizer 101 and has a simple configuration.

(Embodiment 5)

Embodiment 5 of the present invention will now be explained in detail below with reference to the accompanying drawings.

Figure 12:
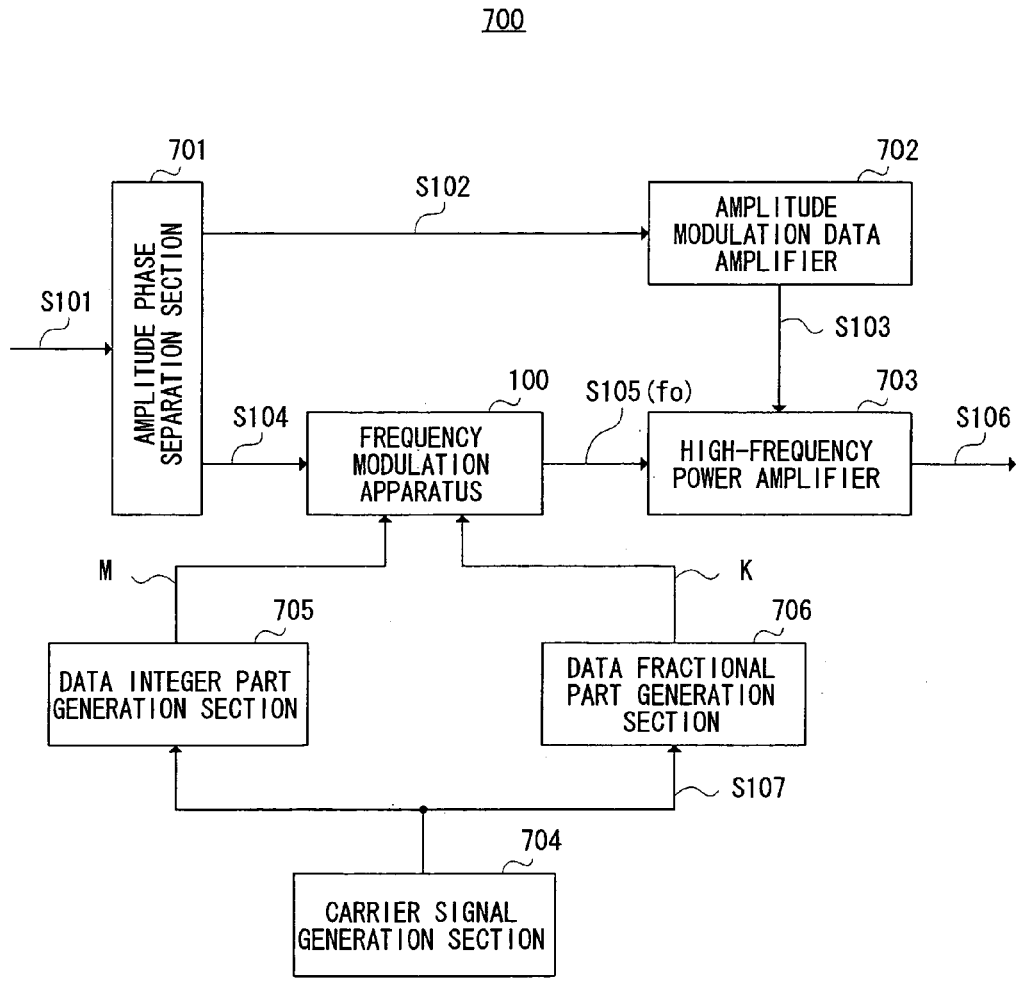
FIG. 12 is a block diagram showing the configuration of a transmitting apparatus according to Embodiment 5 of the present invention.

FIG. 12 is a block diagram showing the configuration of a transmitting apparatus according to Embodiment 5 of the present invention. Configuration elements in Embodiment 5 of the present invention identical to those in Embodiment 1 of the present invention are assigned the same reference codes as in Embodiment 1, and descriptions thereof are omitted.

As shown in FIG. 12, a transmitting apparatus 700 according to Embodiment 5 of the present invention is equipped with an amplitude phase separation section 701, an amplitude modulation data amplifier 702, a frequency modulation apparatus 100, a high-frequency power amplifier 703, a carrier signal generation section 704, a data integer part generation section 705, and a data fractional part generation section 706.

Amplitude phase separation section 701 receives a baseband modulation signal S101, and separates this signal into amplitude modulation data S102 and phase modulation data S104. Amplitude modulation data amplifier 702 receives and amplifies amplitude modulation data S102 from amplitude phase separation section 701, and provides the result to high-frequency power amplifier 703 as a power supply voltage S103.

Carrier signal generation section 704 generates a carrier signal S107, and provides this carrier signal S107 to data integer part generation section 705 and data fractional part generation section 706. Data integer part generation section 705 receives carrier signal S107 from carrier signal generation section 704, generates carrier frequency data integer part M, and provides this carrier frequency data integer part M to frequency modulation apparatus 100. Data fractional part generation section 706 receives carrier signal S107 from carrier signal generation section 704, generates carrier frequency data fractional part K, and provides this carrier frequency data fractional part K to frequency modulation apparatus 100.

Frequency modulation apparatus 100 receives phase modulation data S104 from amplitude phase separation section 701, carrier frequency data integer part M from data integer part generation section 705, and carrier frequency data fractional part K from data fractional part generation section 706, generates an output frequency fo high-frequency phase modulation signal S105 as described earlier, and provides this high-frequency phase modulation signal S105 to high-frequency power amplifier 703. High-frequency power amplifier 703 amplifies high-frequency phase modulation signal S105 in accordance with power supply voltage S103 from amplitude modulation data amplifier 702, and provides the result to an antenna as a transmit output signal S106. This antenna receives transmit output signal S106 and generates and transmits a radio transmit signal.

Transmitting apparatus 700 according to Embodiment 5 of the present invention may be configured so as to be equipped with frequency modulation apparatus 200, frequency modulation apparatus 500, or frequency modulation apparatus 600 instead of frequency modulation apparatus 100.

(Embodiment 6)

Embodiment 6 of the present invention will now be explained in detail below with reference to the accompanying drawings.

Figure 13:
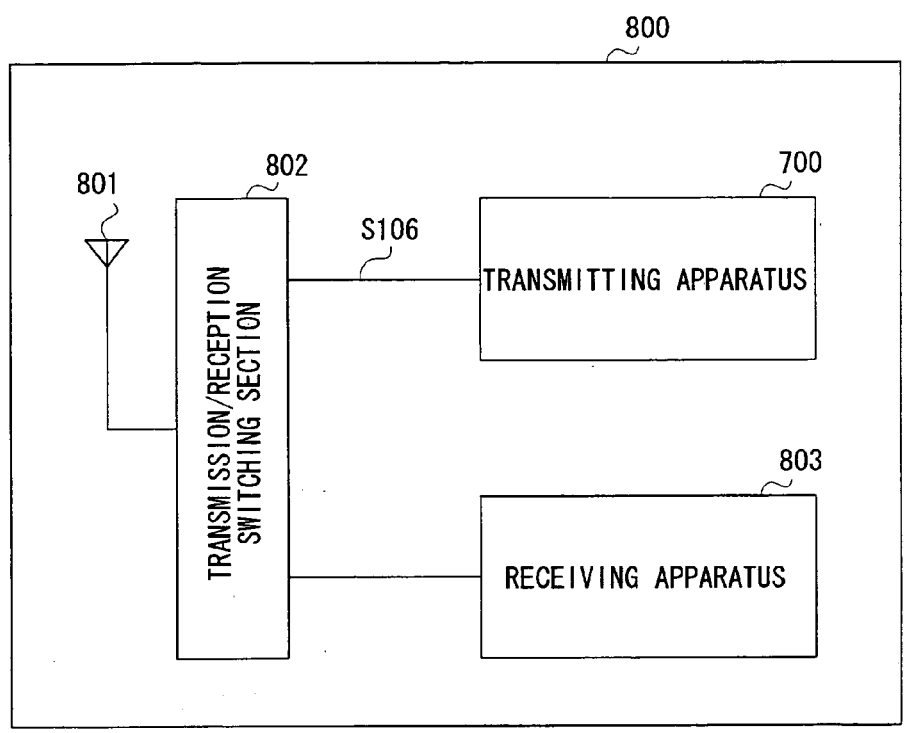
FIG. 13 is a block diagram showing the configuration of a radio communication device according to Embodiment 6 of the present invention.

FIG. 13 is a block diagram showing the configuration of a radio communication device according to Embodiment 6 of the present invention. Configuration elements in Embodiment 6 of the present invention identical to those in Embodiment 5 of the present invention are assigned the same reference codes as in Embodiment 5, and descriptions thereof are omitted.

As shown in FIG. 13, a radio communication device 800 according to Embodiment 6 of the present invention is equipped with an antenna 801, a transmission/reception switching section 802, a transmitting apparatus 700, and a receiving apparatus 803.

Transmitting apparatus 700 provides transmit output signal S106 to antenna 801 via transmission/reception switching section 802. Antenna 801 receives transmit output signal S106 from transmitting apparatus 700 via transmission/reception switching section 802.

Antenna 801 receives a radio transmit signal from a far-end radio communication device, generates a received signal, and provides this received signal to receiving apparatus 803 via transmission/reception switching section 802 and generates and transmits a radio transmit signal.

A frequency modulation apparatus according to a first aspect of the present invention has a synthesizer; an adder that adds together differential phase modulation data and carrier frequency data fractional part K and generates an addition fractional part K1; an input data operation section that receives addition fractional part K1 and carrier frequency data integer part M, generates integer part input data M1 and fractional part input data K2, and provides fractional part input data K2 directly to the synthesizer; and an integer part data delay section that provides integer part input data M1 to the synthesizer delayed from first generation to second generation of a clock signal; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a delta sigma modulation section that by integrating and delaying fractional part input data K2 from the input data operation section to generate a delayed signal and adding together a value of the delayed signal and the value of integer part input data M1 from the integer part data delay section performs delta sigma modulation of fractional part input data K2, generates the control input signal, and provides this control input signal to the loop frequency divider.

According to this configuration, differential phase modulation data and carrier frequency data fractional part K are added together and an addition fractional part K1 is generated, addition fractional part K1 and carrier frequency data integer part M are received, integer part input data M1 and fractional part input data K2 are generated, and fractional part input data K2 is provided directly to the synthesizer, and integer part input data M1 is provided to the synthesizer delayed from first generation to second generation of a clock signal; and the synthesizer, by integrating fractional part input data K2 and adding together the value of the delayed signal and the value of integer part input data M1, performs delta sigma modulation of fractional part input data K2, and generates a control input signal that is provided to the loop frequency divider, thereby enabling a high-precision frequency modulation apparatus to be provided that has a precision synthesizer and has a simple configuration.

A frequency modulation apparatus according to a second aspect of the present invention has a synthesizer; a differentiator that differentiates phase modulation data and generates differential phase modulation data; an adder that adds together the differential phase modulation data and carrier frequency data fractional part K and generates an addition fractional part K1; an input data operation section that receives addition fractional part K1 and carrier frequency data integer part M, generates integer part input data M1 and fractional part input data K2, and provides fractional part input data K2 directly to the synthesizer; and an integer part data delay section that provides integer part input data M1 to the synthesizer delayed from first generation to second generation of a clock signal; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together fractional part input data K2 and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that integrates the latched output signal and generates a second carry output signal at the time of second generation of the clock signal; a section that delays the first carry output signal until second generation of the clock signal; a section that differentiates the second carry output signal; and a section that combines delayed integer part input data M1 and the delayed first carry output signal and the differentiated second carry output signal and generates the aforementioned control input signal; and wherein the input data operation section makes M1=M−1 and K2=K1+1 when K1<0, makes M1=M and K2=K1 when 0≦K1<1, and makes M1=M+1 and K2=K1−1 when 1≦K1.

According to this configuration, phase modulation data is differentiated and differential phase modulation data is generated, the differential phase modulation data and carrier frequency data fractional part K are added together and an addition fractional part K1 is generated and provided to the input data operation section, and, based on addition fractional part K1 and carrier frequency data integer part M, this input data operation section makes M1=M−1 and K2=K1+1 when K1<0, makes M1=M and K2=K1 when 0≦K1<1, and makes M1=M+1 and K2=K1−1 when 1≦K1—that is, performs processing of a value exceeding the range of 0 or more to less than 1 among phase modulation data (overflow processing), generates integer part input data M1 and fractional part input data K2, and provides fractional part input data K2 directly to the first adder of the synthesizer—thereby enabling a high-precision frequency modulation apparatus to be provided that has a precision synthesizer and has a simple configuration.

A frequency modulation apparatus according to a third aspect of the present invention has a synthesizer; an input data operation section that receives phase modulation data K3 and carrier frequency data integer part M, and generates integer part input data M1 and phase modulation data K4; an integer part data delay section that provides integer part input data M1 to the synthesizer delayed from first generation to second generation of a clock signal; and a phase modulation input data adder that receives phase modulation data K4; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a delta sigma modulation section that by integrating and delaying carrier frequency data fractional part K to generate a delayed signal and adding together the value of the delayed signal and the value of integer part input data M1 from the integer part data delay section performs delta sigma modulation of fractional part K, generates the control input signal, and provides this control input signal to the loop frequency divider.

According to this configuration, phase modulation data K3 and carrier frequency data integer part M are received, and integer part input data M1 and phase modulation data K4 are generated, integer part input data M1 is provided to the synthesizer delayed from first generation to second generation of a clock signal, and a phase modulation input data adder that receives phase modulation data K4; and the synthesizer, by integrating carrier frequency data fractional part K and adding together the value of the delayed signal and the value of integer part input data M1, performs delta sigma modulation of fractional part K, and generates a control input signal that is provided to the loop frequency divider, thereby enabling a high-precision frequency modulation apparatus to be provided that has a precision synthesizer and has a simple configuration.

A frequency modulation apparatus according to a fourth aspect of the present invention has a synthesizer; an input data operation section that receives phase modulation data K3 and carrier frequency data integer part M, and generates integer part input data M1 and phase modulation data K4; an integer part data delay section that provides integer part input data M1 to the synthesizer delayed from first generation to second generation of a clock signal; and a phase modulation input data adder that receives phase modulation data K4; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines delayed integer part input data M1 and the delayed first carry output signal and the differentiated second carry output signal and generates the aforementioned control input signal; wherein the input data operation section makes M1=M−1 and K4=K3+1 when K3<0, makes M1=M and K4=K3 when 0≦K3<1, and makes M1=M+1 and K4=K3−1 when 1≦K3; and the phase modulation input data adder adds together phase modulation data K4 and the integrated value of the output signal latched by the first feedback logic section, generates the input data addition output signal, and provides this input data addition output signal to the second adder.

According to this configuration, phase modulation data K3 and carrier frequency data integer part M are received, provision is made so that M1=M−1 and K4=K3+1 when K3<0, M1=M and K4=K3 when 0≦K3<1, and M1=M+1 and K4=K3−1 when 1≦K3—that is, processing of a value exceeding the range of 0 or more to less than 1 among phase modulation data (overflow processing) is performed, integer part input data M1 and phase modulation data K4 are generated and phase modulation data K4 is provided directly to the first adder of the synthesizer, the phase modulation input data adder adds together phase modulation data K4 and the integrated value of the output signal latched by the first feedback logic section of the synthesizer, generates an input data addition output signal and provides this signal to the second adder of the synthesizer, thereby enabling a high-precision frequency modulation apparatus to be provided that has a precision synthesizer and has a simple configuration. Also, according to this configuration, a differentiator that differentiates phase modulation data and generates differential phase modulation data is not necessary, enabling the configuration to be made simpler than that of a frequency modulation apparatus according to the first aspect of the present invention.

A frequency modulation apparatus according to a fifth aspect of the present invention has a synthesizer; an input data operation section that adds a predetermined fixed value to a phase modulation data value and generates modulation input data K5; and a phase modulation input data adder that receives phase modulation data K5; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a reference value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines carrier frequency data integer part input data M and the delayed first carry output signal and the differentiated second carry output signal and generates the aforementioned control input signal; and wherein the phase modulation input data adder adds together phase modulation data K5 and the value of the output signal latched by the first feedback logic section, generates the input data addition output signal, and provides this input data addition output signal to the second adder.

According to this configuration there are provided an input data operation section that adds a predetermined fixed value to a phase modulation data value and generates modulation input data K5, and a phase modulation input data adder that receives phase modulation data K5; and the phase modulation input data adder adds together phase modulation data K5 and the value of the output signal latched by the first feedback logic section of the synthesizer, generates an input data addition output signal, and provides this input data addition output signal to the second adder, thereby enabling a high-precision frequency modulation apparatus to be provided that has a precision synthesizer and has a simple configuration. Also, according to this configuration, phase modulation data in the range of 0 or more to less than 1 can be processed by adding a predetermined fixed value.

A frequency modulation apparatus according to a sixth aspect of the present invention has a synthesizer and a phase modulation input data adder that receives phase modulation data; wherein the synthesizer receives a digital number of a plurality of bits and selects a controllable oscillator output signal frequency, divides that output signal frequency by means of a loop frequency divider, and, the loop frequency divider having a variable divisor controlled by a control input signal, generates a feedback signal that is to be compared with a reference signal; having a configuration equipped with a section that generates the aforementioned clock signal; a section that has a first adder that adds together carrier frequency data fractional part K and a first addition feedback value, a first comparator that compares the output value of the first adder and a predetermined numeric value and generates a first carry output signal, and a first feedback logic section that latches the output signal of the first adder and makes it the first addition feedback value, and generates the latched output signal and the first carry output signal at the time of first generation of the clock signal; a section that has a second adder that adds together the value of an input data addition output signal from the phase modulation input data adder and a second addition feedback value, a second comparator that compares the output value of the second adder and a predetermined numeric value and generates a second carry output signal, and a second feedback logic section that latches the output signal of the second adder and makes it the second addition feedback value, and generates the second carry output signal at the time of second generation of the clock signal; a section that delays the first carry output signal until second generation of the clock signal; a section that differentiates the second carry output signal; and a section that combines carrier frequency data integer part input data M and the delayed first carry output signal and the differentiated second carry output signal and generates the aforementioned control input signal; and wherein the phase modulation input data adder adds together the phase modulation data and the value of the output signal latched by the first feedback logic section, generates the input data addition output signal, and provides this input data addition output signal to the second adder.

According to this configuration a phase modulation input data adder is provided that receives phase modulation data; and the phase modulation input data adder adds together the phase modulation data and the value of the output signal latched by the first feedback logic section of the synthesizer, generates an input data addition output signal, and provides this input data addition output signal to the second adder, thereby enabling a high-precision frequency modulation apparatus to be provided that has a precision synthesizer and has a simple configuration. Also, according to this configuration, phase modulation data in the range of 0 or more to less than 1 can be processed.

A transmitting apparatus according to a seventh aspect of the present invention has a configuration equipped with a frequency modulation apparatus according to the first aspect of the present invention.

According to this configuration, a high-precision frequency modulation apparatus according to the first aspect of the present invention is provided that has a precision synthesizer and has a simple configuration, enabling high-quality radio transmit signals to be generated.

A radio communication device according to an eighth aspect of the present invention has a configuration equipped with a transmitting apparatus according to the seventh aspect of the present invention.

According to this configuration, a transmitting apparatus according to the seventh aspect of the present invention is provided, enabling high-quality radio transmit signals to be generated.

The present invention is not limited to the above-described embodiments, and various variations and modifications may be possible without departing from the scope of the present invention.

This application is based on Japanese Patent Application No.2004-080335 filed on Mar. 19, 2004, the entire content of which is expressly incorporated by reference herein.

What is claimed is:

1. A frequency modulation apparatus comprising:
a synthesizer;
an adder that adds together differential phase modulation data and a fractional part K of carrier frequency data and generates an addition fractional part K1;
an input data operation section that receives said addition fractional part K1 and said carrier frequency data integer part M, generates integer part input data M1 and fractional part input data K2, and provides said fractional part input data K2 directly to said synthesizer; and
an integer part data delay section that provides said integer part input data M1 to said synthesizer delayed from first generation to second generation of a clock signal;
wherein said synthesizer:
receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal;
and includes a delta sigma modulation section that by integrating and delaying said fractional part input data K2 from said input data operation section to generate a delayed signal and adding together a value of said delayed signal and a value of said integer part input data M1 from said integer part data delay section performs delta sigma modulation of said fractional part input data K2, generates said control input signal, and provides said control input signal to said loop frequency divider.

2. A frequency modulation apparatus comprising:
a synthesizer;
a differentiator that differentiates phase modulation data and generates differential phase modulation data;
an adder that adds together said differential phase modulation data and a fractional part K of carrier frequency data and generates an addition fractional part K1;
an input data operation section that receives said addition fractional part K1 and an integer part M of said carrier frequency data, generates integer part input data M1 and fractional part input data K2, and provides said fractional part input data K2 directly to said synthesizer; and
an integer part data delay section that provides said integer part input data M1 to said synthesizer delayed from first generation to second generation of a clock signal;
wherein said synthesizer:
receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal;
and includes:
a section that generates said clock signal;
a section that has a first adder that adds together said fractional part input data K2 and a first addition feedback value, a first comparator that compares an output value of said first adder and a predetermined numeric value and generates a first carry output signal, and a first feedback logic section that latches an output signal of said first adder and makes it said first addition feedback value, and generates said latched output signal and said first carry output signal at the time of first generation of said clock signal;
a section that integrates said latched output signal and generates a second carry output signal at the time of second generation of said clock signal;
a section that delays said first carry output signal until second generation of said clock signal;
a section that differentiates said second carry output signal; and
a section that combines said delayed integer part input data M1 and said delayed first carry output signal and said differentiated second carry output signal and generates said control input signal;
and wherein said input data operation section makes M1=M−1 and K2=K1+1 when K1<0, makes M1=M and K2=K1 when 0≦K1<1, and makes M1=M+1 and K2=K1−1 when 1≦K1.

3. A frequency modulation apparatus comprising:
a synthesizer;
an input data operation section that receives phase modulation data K3 and carrier frequency data integer part M, and generates integer part input data M1 and phase modulation data K4;
an integer part data delay section that provides said integer part input data M1 to said synthesizer delayed from first generation to second generation of a clock signal; and
a phase modulation input data adder that receives said phase modulation data K4;

wherein said synthesizer:
receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal; and
includes a delta sigma modulation section that by integrating and delaying a fractional part K of said carrier frequency data to generate a delayed signal and adding together a value of said delayed signal and a value of said integer part input data M1 from said integer part data delay section performs delta sigma modulation of said fractional part K, generates said control input signal, and provides said control input signal to said loop frequency divider.

4. A frequency modulation apparatus comprising:
a synthesizer;
an input data operation section that receives phase modulation data K3 and a carrier frequency data integer part M, and generates integer part input data M1 and phase modulation data K4;
an integer part data delay section that provides said integer part input data M1 to said synthesizer delayed from first generation to second generation of a clock signal; and
a phase modulation input data adder that receives said phase modulation data K4;
wherein said synthesizer:
receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal;
and includes:
a section that generates said clock signal;
a section that has a first adder that adds together a fractional part K of said carrier frequency data and a first addition feedback value, a first comparator that compares an output value of said first adder and a predetermined numeric value and generates a first carry output signal, and a first feedback logic section that latches an output signal of said first adder and makes it said first addition feedback value, and generates said latched output signal and said first carry output signal at the time of first generation of said clock signal;
a section that has a second adder that adds together a value of an input data addition output signal from said phase modulation input data adder and a second addition feedback value, a second comparator that compares an output value of said second adder and a predetermined numeric value and generates a second carry output signal, and a second feedback logic section that latches an output signal of said second adder and makes it said second addition feedback value, and generates said second carry output signal at the time of second generation of said clock signal;
a section that delays said first carry output signal until second generation of said clock signal;
a section that differentiates said second carry output signal; and
a section that combines said delayed integer part input data M1 and said delayed first carry output signal and said differentiated second carry output signal and generates said control input signal;
and wherein:
said input data operation section makes M1=M−1 and K4=K3+1 when K3<0, makes M1=M and K4=K3 when 0≦K3<1, and makes M1=M+1 and K4=K3−1 when 1≦K3; and
said phase modulation input data adder adds together said phase modulation data K4 and said integrated value of said output signal latched by said first feedback logic section, generates said input data addition output signal, and provides said input data addition output signal to said second adder.

5. A frequency modulation apparatus comprising:
a synthesizer;
an input data operation section that adds a predetermined fixed value to a phase modulation data value and generates modulation input data K5; and
a phase modulation input data adder that receives said phase modulation data K5;
wherein the synthesizer:
receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal;
and includes:
a section that generates a clock signal;
a section that has a first adder that adds together a fractional part K of carrier frequency data and a first addition feedback value, a first comparator that compares an output value of said first adder and a reference value and generates a first carry output signal, and a first feedback logic section that latches an output signal of said adder and makes it said first addition feedback value, and generates said latched output signal and said first carry output signal at the time of first generation of said clock signal;
a section that has a second adder that adds together a value of an input data addition output signal from said phase modulation input data adder and a second addition feedback value, a second comparator that compares an output value of said second adder and a predetermined numeric value and generates a second carry output signal, and a second feedback logic section that latches an output signal of said second adder and makes it said second addition feedback value, and generates said second carry output signal at the time of second generation of said clock signal;
a section that delays said first carry output signal until second generation of said clock signal;
a section that differentiates said second carry output signal; and
a section that combines integer part input data M of said carrier frequency data and said delayed first carry output signal and said differentiated second carry output signal and generates said control input signal;
and wherein said phase modulation input data adder adds together said phase modulation data K5 and a value of said output signal latched by said first feedback logic section, generates said input data addition output signal, and provides said input data addition output signal to said second adder.

6. A frequency modulation apparatus comprising:

a synthesizer; and a phase modulation input data adder that receives phase modulation data;

wherein said synthesizer:

receives a digital number of a plurality of bits and selects a controllable oscillator output signal frequency, divides said output signal frequency by means of a loop frequency divider, and, said loop frequency divider having a variable divisor controlled by a control input signal, generates a feedback signal that is to be compared with a reference signal;

and includes:

a section that generates a clock signal;

a section that has a first adder that adds together a fractional part K of carrier frequency data and a first addition feedback value, a first comparator that compares an output value of said first adder and a predetermined numeric value and generates a first carry output signal, and a first feedback logic section that latches an output signal of said first adder and makes it said first addition feedback value, and generates said latched output signal and said first carry output signal at the time of first generation of said clock signal;

a section that has a second adder that adds together a value of an input data addition output signal from said phase modulation input data adder and a second addition feedback value, a second comparator that compares an output value of said second adder and a predetermined numeric value and generates a second carry output signal, and a second feedback logic section that latches an output signal of said second adder and makes it said second addition feedback value, and generates said second carry output signal at the time of second generation of the clock signal;

a section that delays said first carry output signal until second generation of said clock signal;

a section that differentiates said second carry output signal; and a section that combines said carrier frequency data integer part input data M and said delayed first carry output signal and said differentiated second carry output signal and generates said control input signal;

and wherein said phase modulation input data adder adds together said phase modulation data and a value of said output signal latched by said first feedback logic section, generates said input data addition output signal, and provides said input data addition output signal to said second adder.

7. A transmitting apparatus equipped with the frequency modulation apparatus according to claim 1.

8. A radio communication device equipped with the transmitting apparatus according to claim 7.

* * * * *